(12) United States Patent
Ingle et al.

(10) Patent No.: US 7,037,859 B2
(45) Date of Patent: May 2, 2006

(54) METHOD USING TEOS RAMP-UP DURING TEOS/OZONE CVD FOR IMPROVED GAP-FILL

(75) Inventors: Nitin K. Ingle, Campbell, CA (US); Xinyua Xia, San Jose, CA (US); Zheng Yuan, Fremont, CA (US)

(73) Assignee: Applied Material Inc., Santa Clara, CA (US)

( * ) Notice: Subject to any disclaimer, the term of this patent is extended or adjusted under 35 U.S.C. 154(b) by 0 days.

(21) Appl. No.: 10/979,471

(22) Filed: Nov. 1, 2004

(65) Prior Publication Data
US 2005/0064730 A1 Mar. 24, 2005

Related U.S. Application Data

(63) Continuation of application No. 10/247,672, filed on Sep. 19, 2002, now Pat. No. 6,905,940.

(51) Int. Cl.
*H01L 21/31* (2006.01)
(52) U.S. Cl. .................. 438/763; 438/790; 438/778; 438/787; 438/958
(58) Field of Classification Search .............. None
See application file for complete search history.

(56) References Cited

U.S. PATENT DOCUMENTS

| 5,356,722 | A | 10/1994 | Nguyen et al. |
| 5,710,079 | A | 1/1998 | Sukharev |
| 5,807,785 | A | 9/1998 | Ravi |
| 5,965,203 | A | 10/1999 | Gabric et al. |
| 6,043,136 | A | 3/2000 | Jang et al. |
| 6,106,678 | A | 8/2000 | Shufflebotham et al. |
| 6,133,160 | A * | 10/2000 | Komiyama et al. ......... 438/761 |
| 6,149,987 | A | 11/2000 | Perng et al. |
| 6,218,268 | B1 | 4/2001 | Xia et al. |
| 6,236,105 | B1 | 5/2001 | Kariya |
| 6,319,849 | B1 * | 11/2001 | Oda et al. ................... 438/763 |
| 6,331,494 | B1 | 12/2001 | Olson et al. |
| 6,340,435 | B1 | 1/2002 | Bjorkman et al. |

(Continued)

FOREIGN PATENT DOCUMENTS

TW 479315 A 3/2002

OTHER PUBLICATIONS

Fujino et al., "Dependence of Deposition Characteristics on Base Materials in TEOS and Ozone CVD at Atmospheric Pressure," *J. Electrochem. Soc.*, 138(2):550-554 (1991).

(Continued)

*Primary Examiner*—Luan Thai
(74) *Attorney, Agent, or Firm*—Townsend and Townsend And Crew (57) ABSTRACT

Embodiments of the present invention provide methods, apparatuses, and devices related to chemical vapor deposition of silicon oxide. In one embodiment, a single-step deposition process is used to efficiently form a silicon oxide layer exhibiting high conformality and favorable gap-filling properties. During a pre-deposition gas flow stabilization phase and an initial deposition stage, a relatively low ratio of silicon-containing gas:oxidant deposition gas is flowed, resulting in formation of highly conformal silicon oxide at relatively slow rates. Over the course of the deposition process step, the ratio of silicon-containing gas:oxidant gas is increased, resulting in formation of less-conformal oxide material at relatively rapid rates during later stages of the deposition process step.

46 Claims, 9 Drawing Sheets

U.S. PATENT DOCUMENTS

| | | | |
|---|---|---|---|
| 6,348,421 B1 | 2/2002 | Shu et al. | |
| 6,489,254 B1 | 12/2002 | Kelkar et al. | |
| 6,617,259 B1 * | 9/2003 | Jung et al. | 438/763 |
| 6,733,955 B1 | 5/2004 | Geiger et al. | |
| 2002/0000195 A1 | 1/2002 | Bang et al. | |
| 2002/0052128 A1 | 5/2002 | Yu et al. | |

OTHER PUBLICATIONS

Kwok et al., "Surface Releated Phenomena in Integrated PECVD/Ozone-TEOS SACVD Process for Sub-Half Micron Gap Fill: Electrostatic Effects," *J. Electrochem. Soc.,* 141(8):2172-2177 (1994).

* cited by examiner

METHOD USING TEOS RAMP-UP DURING TEOS/OZONE CVD FOR IMPROVED GAP-FILL

CROSS-REFERENCES TO RELATED APPLICATIONS

This application is a continuation claims priority to U.S. application Ser. No. 10/247,672, filed Sep. 19, 2002 now U.S. Pat. No. 6,905,940, which is incorporated by reference herein.

BACKGROUND OF THE INVENTION

The fabrication sequence of integrated circuits often includes several patterning processes. The patterning processes may define a layer of conductors, such as a patterned metal or polysilicon layer, or may define isolation structures, such as trenches. In many cases the trenches are filled with an insulating, or dielectric, material. This insulating material can serve several functions. For example, in some applications the material serves to both electrically isolate one region of the IC from another, and electrically passivate the surface of the trench. The material also typically provides a base for the next layer of the semiconductor to be built upon.

After patterning a substrate, the patterned material is not flat. The topology of the pattern can interfere with or degrade subsequent wafer processing. It is often desirable to create a flat surface over the patterned material. Several methods have been developed to create such a flat, or "planarized", surface. Examples include depositing a conformal layer of material of sufficient thickness and polishing the wafer to obtain a flat surface, depositing a conformal layer of material of sufficient thickness and etching the layer back to form a planarized surface, and forming a layer of relatively low-melting point material, such as doped silicon oxide, and then heating the wafer sufficiently to cause the doped silicon oxide to melt and flow as a liquid, resulting in a flat surface upon cooling. Each process has attributes that make that process desirable for a specific application.

As semiconductor design has advanced, the feature size of the semiconductor devices has dramatically decreased. Many circuits now have features, such as traces or trenches less than a micron across. While the reduction in feature size has allowed higher device density, more chips per wafer, more complex circuits, lower operating power consumption and lower cost among other benefits, the smaller geometries have also given rise to new problems, or have resurrected problems that were once solved for larger geometries.

An example of the type of manufacturing challenge presented by sub-micron devices is the ability to completely fill a narrow trench in a void-free manner. To fill a trench with silicon oxide, a layer of silicon oxide is first deposited on the patterned substrate. The silicon oxide layer typically covers the field, as well as walls and bottom of the trench. If the trench is wide and shallow, it is relatively easy to completely fill the trench. As the trench gets narrower and the aspect ratio (the ratio of the trench height to the trench width) increases, it becomes more likely that the opening of the trench will "pinch off".

Pinching off a trench may trap a void within the trench. Under certain conditions, the void will be filled during a reflow process, for example where the deposited silicon oxide is doped and experiences viscous flow at elevated temperatures. However, as the trench becomes narrower, it becomes more likely that the void will not be filled during the reflow process. Moreover, several types of applications call for the deposition of undoped silicon oxide, which is difficult to reflow even at elevated temperature. Voids resulting from pinching-off are undesirable as they can reduce the yield of good chips per wafer and the reliability of the devices.

One possible solution to this problem is a two-step process wherein a first deposition step is performed under process conditions with a low silicon-containing gas:oxidizing gas ratio and low deposition rate for achieving the desired gap-fill. After this first step is performed, the flow of silicon-containing process gas to the chamber is interrupted, and then a second distinct deposition step is performed under different conditions with a high silicon-containing gas:oxidizing gas ratio and a high deposition rate for bulk fill. However, such a two-step process may exhibit reduced throughput due to the extended time required in the first step, and also the time consumed in halting the process gas flow and changing the apparatus configuration between the first and second steps.

Therefore, it is desirable to be able to fill narrow gaps with dielectric material in a void-free manner. It is also desirable that the process used to deposit the dielectric material be efficient, reliable, and result in a high yield of devices.

SUMMARY OF THE INVENTION

The present invention provides methods and apparatuses related to chemical vapor deposition of silicon oxide. In one embodiment, a single-step deposition process is used to efficiently form a silicon oxide layer exhibiting good gap-filling properties with high throughput. The silicon oxide layer is initially formed under conditions including a relatively low ratio of silicon-containing gas:oxidizing gas. As the CVD process step continues, the ratio of silicon-containing gas:oxidizing gas is increased. As a result of these changed processing conditions, silicon oxide of a highly conformal character is formed relatively slowly during initial stages of the deposition step, with less conformal oxide formed more rapidly during later stages, thereby allowing for high throughput.

An embodiment of a method for forming a silicon oxide layer in accordance with the present invention comprises providing a continuous flow of a silicon-containing processing gas to a chamber housing a substrate, providing a flow of an oxidizing processing gas to the chamber, and causing a reaction between the silicon-containing processing gas and the oxidizing processing gas to form a silicon oxide layer. Over time, a ratio of the silicon-containing gas:oxidizing gas flowed into the chamber is varied to alter a rate of deposition of the silicon oxide on the substrate.

An embodiment of a substrate processing apparatus in accordance with the present invention comprises a processing chamber, a substrate support configured to support a substrate within the processing chamber, and a gas distribution plate positioned within the processing chamber adjacent to the substrate support. A gas delivery system is configured to receive a silicon-containing process gas and an oxidizing process gas, and to deliver the silicon-containing process gas and the oxidizing process gas to the processing chamber. A controller is configured to control the gas delivery system and the substrate support. The substrate processing apparatus further comprises a memory coupled to the controller, the memory comprising a computer-readable medium having a computer-readable program embodied therein for directing operation of the substrate processing apparatus. The computer-readable program includes a first set of computer instructions for controlling the gas delivery system to introduce the silicon-containing gas and the oxidizing gas into processing chamber at a first relative concentration, and a second set of instructions to vary the concentration of the silicon-containing gas relative to the oxidizing gas over time to deposit silicon oxide on the substrate, as the silicon-containing gas is continuously flowed into the chamber.

These and other embodiments of the present invention, as well as some of its advantages and features are described in more detail in conjunction with the text below and attached figures.

DESCRIPTION OF THE SPECIFIC EMBODIMENTS

The present invention provides methods and apparatuses related to chemical vapor deposition of silicon oxide. In one embodiment, a single-step deposition process is used to efficiently form a silicon oxide layer exhibiting good gap-filling properties with high throughput. The silicon oxide layer is initially formed under conditions including a relatively low ratio of silicon-containing gas:oxidizing gas. As the CVD process step continues, the ratio of silicon-containing gas:ozone is increased. As a result of these changed processing conditions, silicon oxide of a highly conformal character is formed relatively slowly during initial stages of the deposition process step, with less conformal oxide formed more rapidly during later stages, thereby allowing for high throughput.

For purposes of this application, the term "deposition step" refers to a period of continuous flow of a silicon-containing gas to a processing chamber. The term "stage" refers to a portion of a deposition step wherein a relative concentration of the silicon-containing process gas may vary in a consistent manner (i.e. remains constant, changes in a linear manner, or changes in a nonlinear manner).

I. Exemplary Deposition System

Figure 1A:
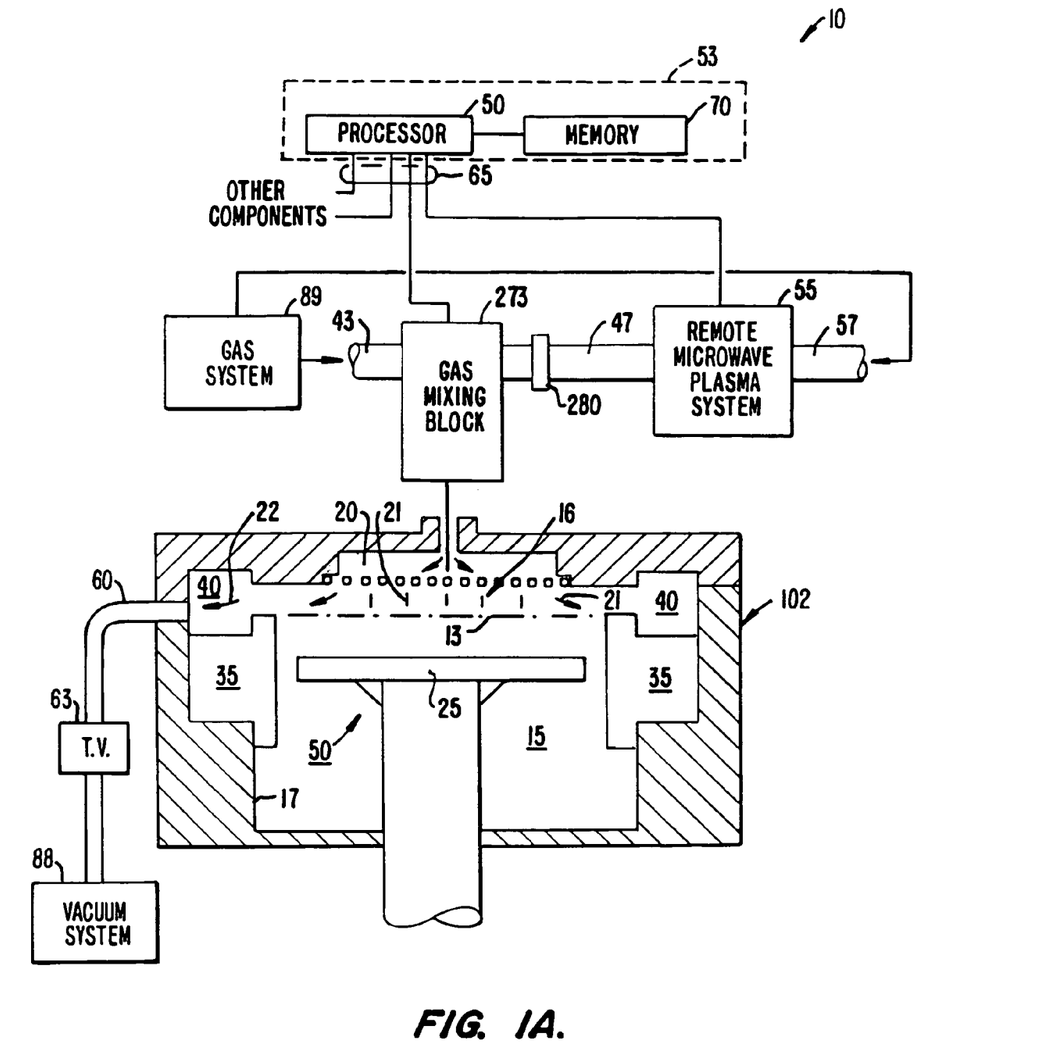
FIG. 1A is a simplified representation of a CVD apparatus according to the present invention.

FIG. 1A is a simplified diagram of a chemical vapor deposition ("CVD") system 10 according to the present invention. This system is suitable for performing thermal, sub-atmospheric CVD ("SACVD") processes, as well as other processes, such as reflow, drive-in, cleaning, etching, and gettering processes. Multiple-step processes can also be performed on a single substrate or wafer without removing the substrate from the chamber. The major components of the system include, among others, a vacuum chamber 15 that receives process and other gases from a gas delivery system 89, a vacuum system 88, a remote microwave plasma system 55, and a control system 53. These and other components are described below in order to understand the present invention.

The CVD apparatus 10 includes an enclosure assembly 102 housing a vacuum chamber 15 with a gas reaction area 16. A gas distribution plate 20 is provided above the gas reaction area 16 for dispersing reactive gases and other gases, such as purge gases, through perforated holes in the gas distribution plate 20 to a wafer (not shown) that rests on a vertically movable heater 25 (also referred to as a wafer support pedestal). The heater 25 can be controllably moved between a lower position, where a wafer can be loaded or unloaded, for example, and a processing position closely adjacent to the gas distribution plate 20, indicated by a dashed line 13, or to other positions for other purposes, such as for an etch or cleaning process. A center board (not shown) includes sensors for providing information on the position of the wafer.

The heater 25 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 25 exposed to the vacuum chamber 15 are made of a ceramic material, such as aluminum oxide ($Al_2O_3$ or alumina) or aluminum nitride.

Reactive and carrier gases are supplied through the supply line 43 into a gas mixing box (also called a gas mixing block) 273, where they are preferably mixed together and delivered to the gas distribution plate 20. The gas mixing box 273 is preferably a dual input mixing block coupled to a process gas supply line 43 and to a cleaning/etch gas conduit 47. A valve 280 operates to admit or seal gas or plasma from the gas conduit 47 to the gas mixing block 273. The gas conduit 47 receives gases from an integral remote microwave plasma system 55, which has an inlet 57 for receiving input gases. During deposition processing, gas supplied to the plate 20 is vented toward the wafer surface (as indicated by arrows 21), where it may be uniformly distributed radially across the wafer surface, typically in a laminar flow.

Purging gas may be delivered into the vacuum chamber 15 from the plate 20 and/or an inlet port or tube (not shown) through the bottom wall of enclosure assembly 102. The purging gas flows upward from the inlet port past the heater 25 and to an annular pumping channel 40. An exhaust system then exhausts the gas (as indicated by arrows 22) into the annular pumping channel 40 and through an exhaust line 60 to a vacuum system 88, which includes a vacuum pump (not shown). Exhaust gases and entrained particles are drawn from the annular pumping channel 40 through the exhaust line 60 at a rate controlled by a throttle valve system 63.

The remote microwave plasma system 55 can produce a plasma for selected applications, such as chamber cleaning or etching native oxide or residue from a process wafer. Plasma species produced in the remote plasma system 55 from precursors supplied via the input line 57 are sent via the conduit 47 for dispersion through the plate 20 to the vacuum chamber 15. Precursor gases for a cleaning application may include fluorine, chlorine, and other reactive elements. The remote microwave plasma system 55 also may be adapted to deposit plasma-enhanced CVD films by selecting appropriate deposition precursor gases for use in the remote microwave plasma system 55.

The system controller 53 controls activities and operating parameters of the deposition system. The processor 50 executes system control software, such as a computer program stored in a memory 70 coupled to the processor 50. Preferably, the memory 70 may be a hard disk drive, but of course the memory 70 may be other kinds of memory, such as read-only memory or flash memory. In addition to a hard disk drive (e.g., memory 70), the CVD apparatus 10 in a preferred embodiment includes a floppy disk drive and a card rack (not shown).

The processor 50 operates according to system control software, which includes sets of instructions that dictate the timing, mixture of gases, chamber pressure, chamber temperature, microwave power levels, susceptor position, and other parameters of a particular process. Other computer programs such as those stored on other memory including, for example, a floppy disk or another computer program product inserted in a disk drive or other appropriate drive, may also be used to operate the processor 50 to configure the CVD system 10 into various apparatus.

The processor 50 has a card rack (not shown) that contains a single-board computer, analog and digital input/output boards, interface boards and stepper motor controller boards. Various parts of the CVD system 10 conform to the Versa Modular European (VME) standard which defines board, card cage, and connector dimensions and types. The VME standard also defines the bus structure having a 16-bit data bus and 24-bit address bus.

Figure 1B:
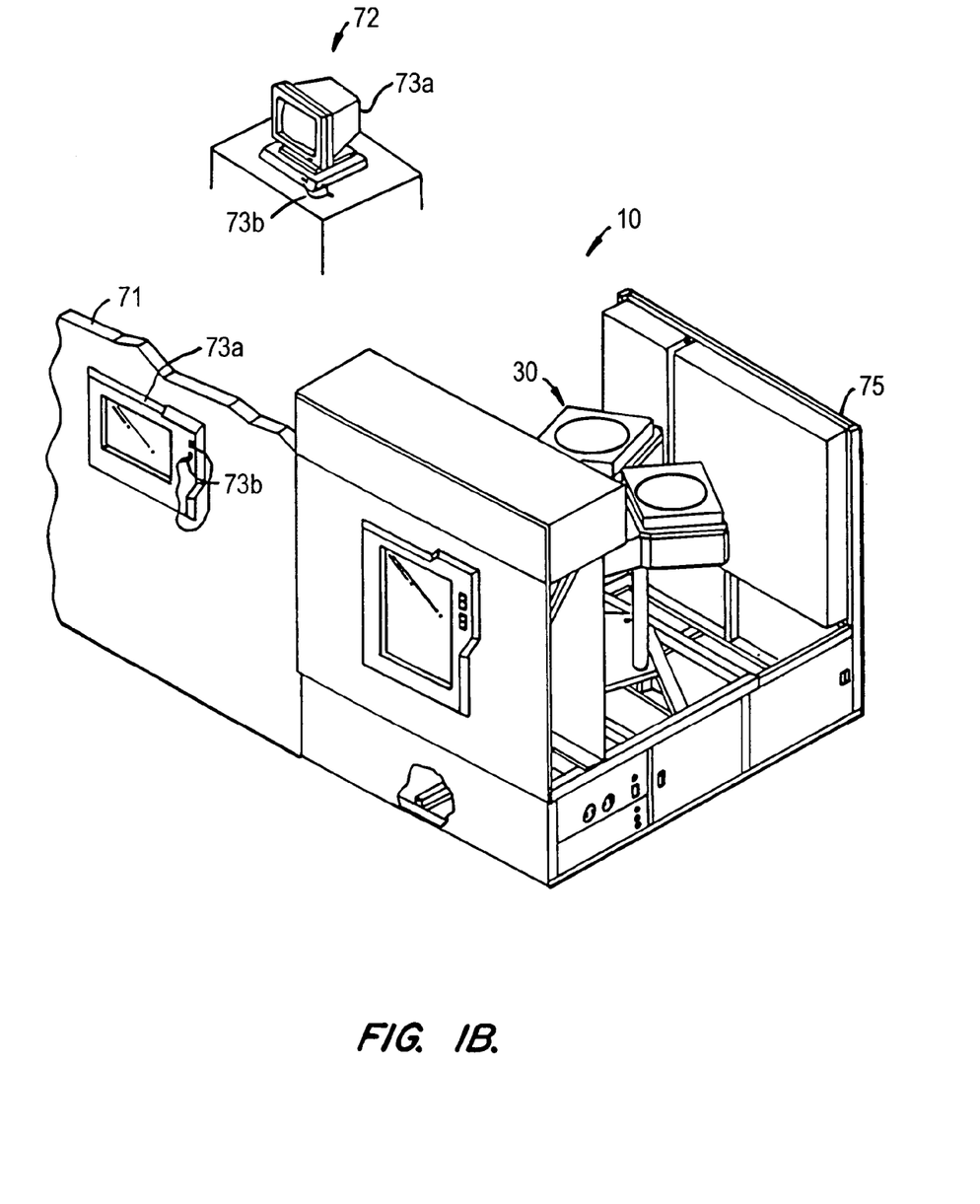
FIG. 1B is a simplified representation of the user interface for a CVD system in relation to a deposition chamber in a multi-chamber system.

FIG. 1B is a simplified diagram of a user interface in relation to the CVD apparatus chamber 30. The CVD apparatus 10 includes one chamber of a multichamber system. Wafers may be transferred from one chamber to another for additional processing. In some cases the wafers are transferred under vacuum or a selected gas. The interface between a user and the processor is via a CRT monitor 73a and a light pen 73b. A mainframe unit 75 provides electrical, plumbing, and other support functions for the CVD apparatus 10. Exemplary mainframe units compatible with the illustrative embodiment of the CVD apparatus are currently commercially available as the PRECISION 5000™, the CENTURA 5200™, and the PRODUCER SE™ systems from APPLIED MATERIALS, INC. of Santa Clara, Calif.

In the preferred embodiment two monitors 73a are used, one mounted in the clean room wall 71 for the operators, and the other behind the wall 72 for the service technicians. Both monitors 73a simultaneously display the same information, but only one light pen 73b is enabled. The light pen 73b detects light emitted by the CRT display with a light sensor in the tip of the pen. To select a particular screen or function, the operator touches a designated area of the display screen and pushes the button on the pen 73b. The touched area changes its highlighted color, or a new menu or screen is displayed, confirming communication between the light pen and the display screen. Of course, other devices, such as a keyboard, mouse, or other pointing or communication device, may be used instead of or in addition to the light pen 73b to allow the user to communicate with the processor.

Figure 1C:
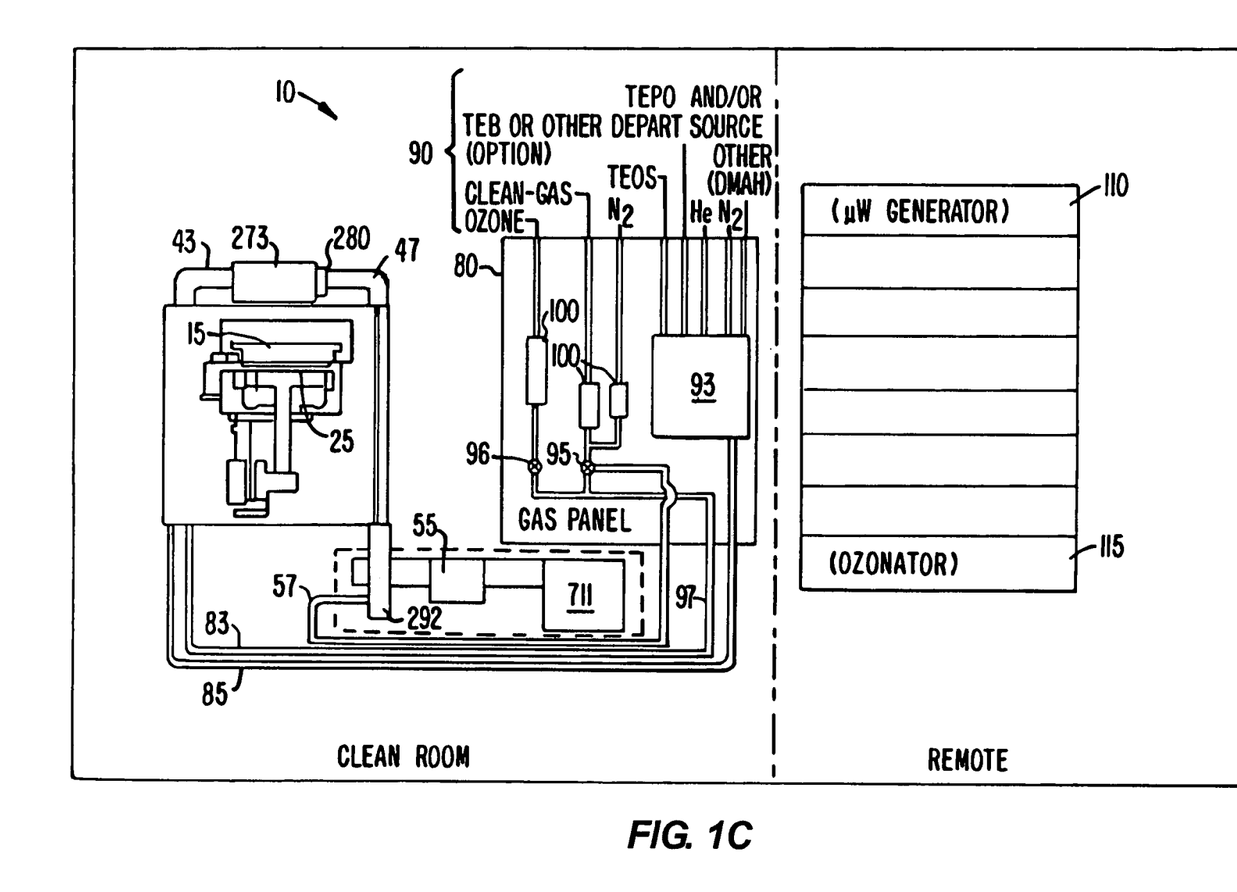
FIG. 1C is a simplified diagram of a gas panel and supply lines in relation to a deposition chamber.

FIG. 1C illustrates a general overview of an embodiment of the CVD apparatus 10 in relation to a gas supply panel 80 located in a clean room. As discussed above, the CVD system 10 includes a chamber 15 with a heater 25, a gas mixing box 273 with inputs from an inlet tube 43 and a conduit 47, and remote microwave plasma system 55 with input line 57. As mentioned above, the gas mixing box 273 is for mixing and injecting deposition gas(es) and clean gas(es) or other gas(es) through the inlet tube 43 to the processing chamber 15.

The remote microwave plasma system 55 is integrally located and mounted below the chamber 15 with the conduit 47 coming up alongside the chamber 15 to the gate valve 280 and the gas mixing box 273, located above the chamber 15. Microwave generator 110 and ozonator 115 are located remote from the clean room. Supply lines 83 and 85 from the gas supply panel 80 provide reactive gases to the gas supply line 43. The gas supply panel 80 includes lines from gas or liquid sources 90 that provide the process gases for the selected application. The gas supply panel 80 has a mixing system 93 that mixes selected gases before flow to the gas mixing box 273. In some embodiments, gas mixing system 93 includes a liquid injection system for vaporizing reactant liquids such as tetraethylorthosilicate ("TEOS"), triethylborate ("TEB"), and triethylphosphate ("TEPO"). Vapor from the liquids is usually combined with a carrier gas, such as helium. Supply lines for the process gases may include (i) shut-off valves 95 that can be used to automatically or manually shut off the flow of process gas into line 85 or line 57, and (ii) liquid flow meters (LFM) 100 or other types of controllers that measure the flow of gas or liquid through the supply lines.

As an example, a mixture including TEOS as a silicon source may be used with gas mixing system 93 in a deposition process for forming a silicon oxide film. The TEPO is a liquid source that may be vaporized by conventional boiler-type or bubbler-type hot boxes. However, a liquid injection system is preferred as it provides greater control of the volume of reactant liquid introduced into the gas mixing system. The liquid is typically injected as a fine spray or mist into the carrier gas flow before being delivered to a heated gas delivery line 85 to the gas mixing block and chamber. One or more sources, such as oxygen ($O_2$) or ozone ($O_3$) flow to the chamber through another gas delivery line 83, to be combined with the reactant gases from heated gas delivery line 85 near or in the chamber. Of course, it is recognized that other sources of dopants, silicon, and oxygen also may be used.

Figure 1D:
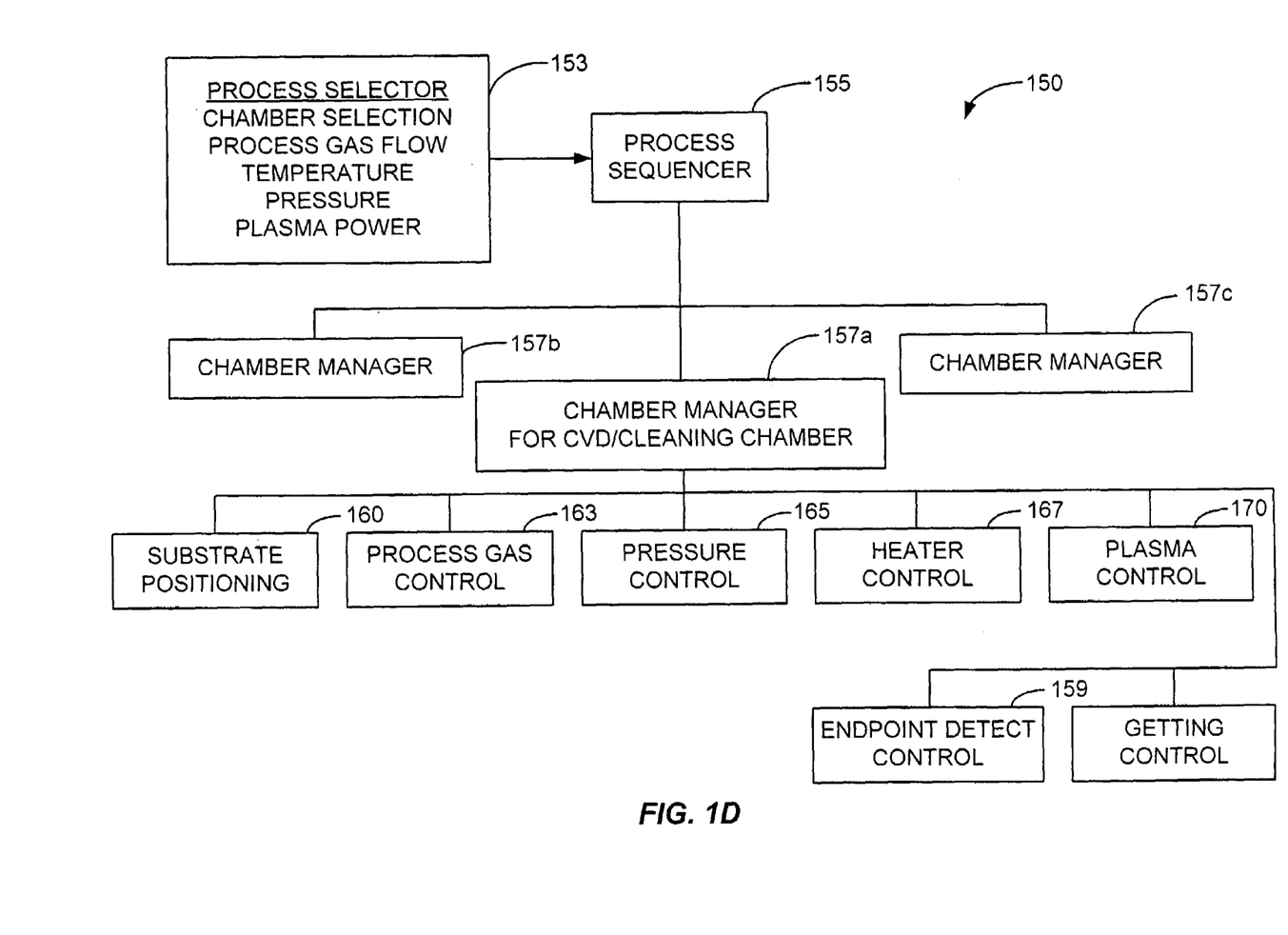
FIG. 1D is a simplified of a block diagram of the hierarchical control structure of the system control software according to a specific embodiment.

FIG. 1D is an illustrative block diagram of the hierarchical control structure of the system control software, computer program 150, according to a specific embodiment. A processes for depositing a film, performing a clean, or performing reflow or drive-in can be implemented using a computer program product that is executed by the processor 50. The computer program code can be written in any conventional computer readable programming language, such as 68000 assembly language, C, C++, Pascal, Fortran, or other language. Suitable program code is entered into a single file, or multiple files, using a conventional text editor and is stored or embodied in a computer-usable medium, such as the system memory.

If the entered code text is in a high-level language, the code is compiled, and the resultant compiler code is then linked with an object code of precompiled WINDOWS™ library routines. To execute the linked compiled object code, the system user invokes the object code, causing the computer system to load the code in memory, from which the CPU reads and executes the code to configure the apparatus to perform the tasks identified in the program.

A user enters a process set number and process chamber number into a process selector subroutine 153 by using the light pen to select a choice provided by menus or screens displayed on the CRT monitor. The process sets, which are predetermined sets of process parameters necessary to carry out specified processes, are identified by predefined set numbers. The process selector subroutine 153 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as magnetron power levels (and alternatively to or in addition to high- and low-frequency RF power levels and the low-frequency RF frequency, for embodiments equipped with RF plasma systems), cooling gas pressure, and chamber wall temperature. The process selector subroutine 153 controls what type of process (e.g. deposition, wafer cleaning, chamber cleaning, chamber gettering, reflowing) is performed at a certain time in the chamber. In some embodiments, there may be more than one process selector subroutine. The process parameters are provided to the user in the form of a recipe and may be entered utilizing the light pen/CRT monitor interface.

A process sequencer subroutine 155 has program code for accepting the identified process chamber and process parameters from the process selector subroutine 153, and for controlling the operation of the various process chambers. Multiple users can enter process set numbers and process chamber numbers, or a single user can enter multiple process set numbers and process chamber numbers, so process sequencer subroutine 155 operates to schedule the selected processes in the desired sequence. Preferably, the process sequencer subroutine 155 includes program code to perform the tasks of (i) monitoring the operation of the process chambers to determine if the chambers are being used, (ii) determining what processes are being carried out in the chambers being used, and (iii) executing the desired process based on availability of a process chamber and the type of process to be carried out.

Conventional methods of monitoring the process chambers, such as polling methods, can be used. When scheduling which process is to be executed, the process sequencer subroutine 155 can be designed to take into consideration the present condition of the process chamber being used in comparison with the desired process conditions for a selected process, or the "age" of each particular user-entered request, or any other relevant factor a system programmer desires to include for determining scheduling priorities.

Once the process sequencer subroutine 155 determines which process chamber and process set combination is going to be executed next, the process sequencer subroutine 155 initiates execution of the process set by passing the particular process set parameters to a chamber manager subroutine 157a–c which controls multiple processing tasks in the process chamber according to the process set determined by the process sequencer subroutine 155. For example, the chamber manager subroutine 157a has program code for controlling CVD and cleaning process operations in the process chamber. Chamber manager subroutine 157 also controls execution of various chamber component subroutines which control operation of the chamber components necessary to carry out the selected process set. Examples of chamber component subroutines are substrate positioning subroutine 160, process gas control subroutine 163, pressure control subroutine 165, heater control subroutine 167, plasma control subroutine 170, endpoint detect control subroutine 159, and gettering control subroutine 169.

Depending on the specific configuration of the CVD chamber, some embodiments include all of the above subroutines, while other embodiments may include only some of the subroutines. Those having ordinary skill in the art would readily recognize that other chamber control subroutines can be included depending on what processes are to be performed in the process chamber.

In operation, the chamber manager subroutine 157a selectively schedules or calls the process component subroutines in accordance with the particular process set being executed. The chamber manager subroutine 157a schedules the process component subroutines much like the process sequencer subroutine 155 schedules which process chamber and process set are to be executed next. Typically, the chamber manager subroutine 157a includes the steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIGS. 1A and 1D. The substrate positioning subroutine 160 comprises program code for controlling chamber components that are used to load the substrate onto the heater 25 and, optionally, to lift the substrate to a desired height in the chamber to control the spacing between the substrate and the gas distribution manifold 20. When a substrate is loaded into the process chamber 15, the heater 25 is lowered to receive the substrate and then the heater 25 is raised to the desired height. In operation, the substrate positioning subroutine 160 controls movement of the heater 25 in response to process set parameters related to the support height that are transferred from the chamber manager subroutine 157a. As discussed below in connection with FIG. 5, the height of the heater 25, and thus the spacing between a substrate disposed thereon and the gas distribution plate 20, may be varied during processing to affect the rate of deposition.

Of particular interest to the present invention is process gas control subroutine 163, which controls the character of the process gases flowed into the chamber. Process gas control subroutine 163 can be designed to vary over time the relative flow rates of the various process gases inlet to the chamber, and hence their relative concentration. Such variation in flow rate can result in desirable processing as is described in detail below.

The process gas control subroutine 163 has program code for controlling process gas composition and flow rates. The process gas control subroutine 163 controls the state of safety shut-off valves, and also ramps the mass flow controllers up or down to obtain the desired gas flow rate. Typically, the process gas control subroutine 163 operates by opening the gas supply lines and repeatedly (i) reading the necessary mass flow controllers, (ii) comparing the readings to the desired flow rates received from the chamber manager subroutine 157a, and (iii) adjusting the flow rates of the gas supply lines as necessary. Furthermore, the process gas control subroutine 163 includes steps for monitoring the gas flow rates for unsafe rates, and activating the safety shut-off valves when an unsafe condition is detected. Alternative embodiments could have more than one process gas control subroutine, each subroutine controlling a specific type of process or specific sets of gas lines.

In some processes, an inert gas, such as nitrogen or argon, is flowed into the chamber to stabilize the pressure in the chamber before reactive process gases are introduced. For these processes, process gas control subroutine 163 is programmed to include steps for flowing the inert gas into the chamber for an amount of time necessary to stabilize the pressure in the chamber, and then the steps described above would be carried out. Additionally, when a process gas is to be vaporized from a liquid precursor, such as TEOS, process gas control subroutine 163 would be written to include steps for bubbling a delivery gas such as helium through the liquid precursor in a bubbler assembly, or controlling a liquid injection system to spray or squirt liquid into a stream of carrier gas, such as helium, through the LFM. When a bubbler is used for this type of process, the process gas control subroutine 163 regulates the flow of the delivery gas, the pressure in the bubbler, and the bubbler temperature in order to obtain the desired process gas flow rates. As discussed above, the desired process gas flow rates are transferred to the process gas control subroutine 163 as process parameters.

Furthermore, the process gas control subroutine 163 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 165 comprises program code for controlling the pressure in the chamber by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When the pressure control subroutine 165 is invoked, the desired or target pressure level is received as a parameter from the chamber manager subroutine 157a. The pressure control subroutine 165 measures the pressure in the chamber by reading one or more conventional pressure manometers connected to the chamber, compares the measure value(s) to the target pressure, obtains proportional, integral, and differential ("PID") values corresponding to the target pressure from a stored pressure table, and adjusts the throttle valve according to the PID values.

Alternatively, the pressure control subroutine 165 can be written to open or close the throttle valve to a particular aperture size, i.e. a fixed position, to regulate the pressure in the chamber. Controlling the exhaust capacity in this way does not invoke the feedback control feature of the pressure control subroutine 165.

The heater control subroutine 167 comprises program code for controlling the current to a heating unit that is used to heat the substrate. The heater control subroutine 167 is also invoked by the chamber manager subroutine 157a and receives a target, or set-point, temperature parameter. The heater control subroutine 167 measures the temperature by measuring voltage output of a thermocouple located in the heater, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. The heater control subroutine 167 includes the ability to gradually control a ramp up or down of the heater temperature. This feature helps to reduce thermal cracking in the ceramic heater. Additionally, a built-in fail-safe mode can be included to detect process safety compliance, and can shut down operation of the heating unit if the process chamber is not properly set up.

II. Exemplary Semiconductor Structure

Figure 2:
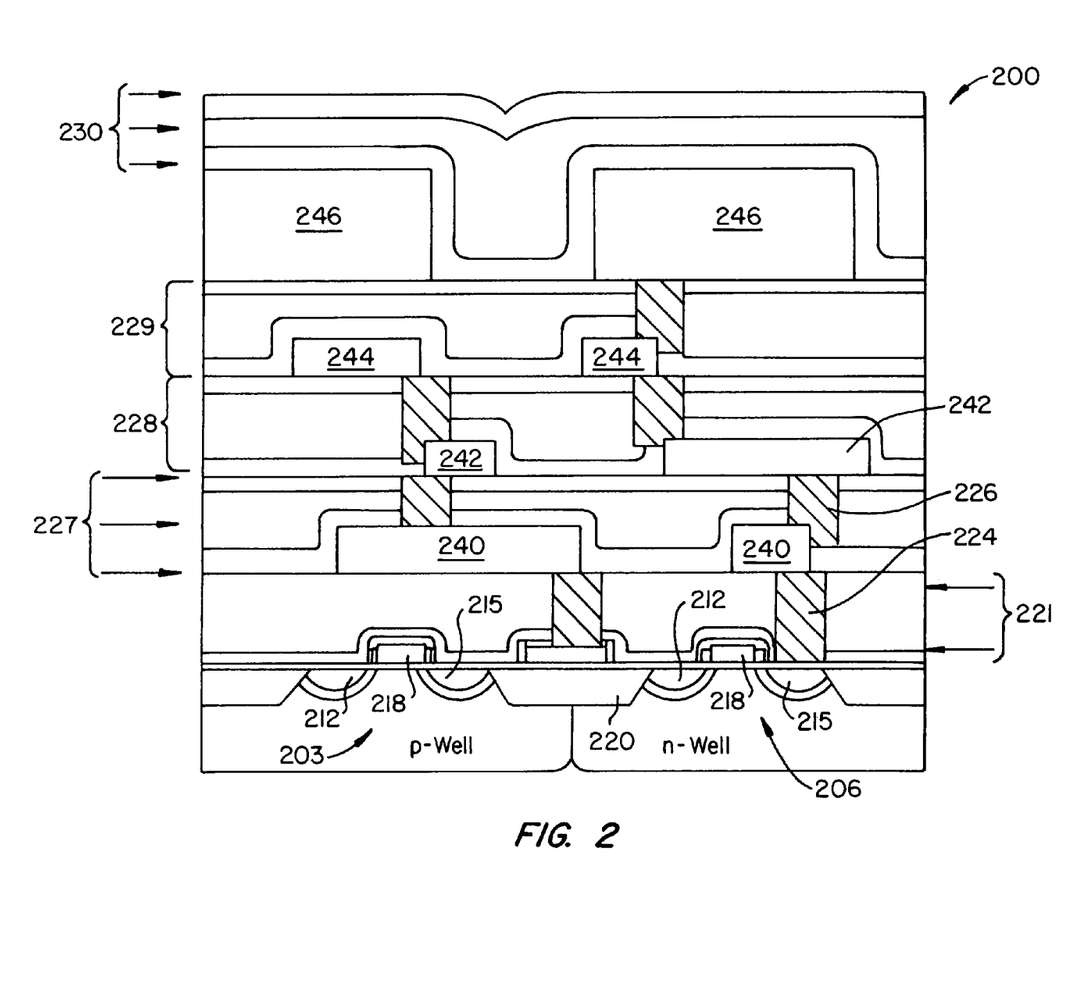
FIG. 2 is a simplified cross section of a portion of an integrated circuit according to the present invention.

FIG. 2 illustrates a simplified cross-sectional view of an integrated circuit 200 according to the present invention. As shown in FIG. 2, the integrated circuit 200 includes NMOS and PMOS transistors 203 and 206, which are separated and electrically isolated from each other by oxide-filled trench isolation structure 220. Alternatively, field oxide isolation can be used to isolate devices, or a combination of isolation techniques may be used. Each of the transistors 203 and 206 comprises a source region 212, a gate region 215, and a drain region 218.

A premetal dielectric (PMD) layer 221 separates the transistors 203 and 206 from the metal layer 240, with connections between metal layer 240 and the transistors made by contacts 224. The premetal dielectric layer 221 may comprise a single layer or multiple layers. The metal layer 240 is one of four metal layers, 240, 242, 244, and 246, included in the integrated circuit 200. Each metal layer is separated from adjacent metal layers by intermetal dielectric layers 227, 228, and 229. Adjacent metal layers are connected at selected openings by vias 226. Planarized passivation layers 230 are deposited over the metal layer 246.

A silicon oxide layer according to the present invention may be used to form one or more of the dielectric layers shown in integrated circuit 200. For example, a silicon oxide layer deposited according to the present invention may be used to create trench isolation structure 220. A silicon oxide layer deposited according to the present invention may also be used to create PMD layer 221, or the higher layer intermetal dielectric layers 227–229 of the overlying interconnect structure.

A silicon oxide layer according to the present invention may also be used in damascene layers, which are included in some integrated circuits. In damascene layers, a blanket layer is deposited over a substrate, selectively etched through to the substrate, and then filled with metal and etched back or polished to form metal contacts 224. After the metal layer is deposited, a second blanket deposition is performed and selectively etched. The etched areas are then filled with metal and etched back or polished to form vias 226.

It should be understood that the simplified integrated circuit 200 is for illustrative purposes only. One of ordinary skill in the art could implement the present method for fabrication of other integrated circuits, such as microprocessors, application-specific integrated circuits (ASICs), memory devices, and the like.

III. An Exemplary Oxide Deposition Process in Accordance With the Present Invention The present invention provides methods, apparatuses, and devices related to chemical vapor deposition of silicon oxide. In one embodiment, a single-step deposition process is used to efficiently form a silicon oxide layer with good gap-filling properties. During a pre-deposition gas flow stabilization stage and an initial deposition stage, a relatively low ratio of silicon-containing gas:ozone is flowed, resulting in the formation at relatively slow rates of silicon oxide exhibiting a highly conformal character. Over the course of the process step, the ratio of silicon-containing gas:ozone is increased to deposit less-conformal oxide material at relatively rapid rates during later stages.

Figure 3:
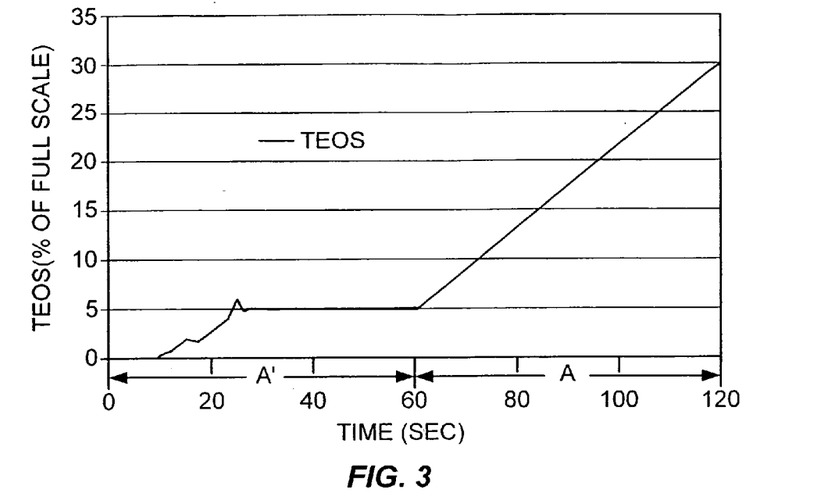
FIG. 3 plots % composition of TEOS in the processing gas mixture flowed during pre-deposition and initial deposition phases of one embodiment of a process in accordance with the present invention.

FIG. 3 plots the percentage of TEOS flowed in the processing gas relative to a maximum TEOS level, versus time for initial phases of an embodiment of a deposition process in accordance with the present invention. Specifically, FIG. 3 illustrates that it is difficult to reliably and controllably ramp up a flow rate of TEOS from a set point of zero. At very small set points, typically less than 5% of the full range, the TEOS flow is not properly regulated by the liquid flow meter that supplies liquid TEOS to the vaporizer. This inconsistent flow profile can lead to unwanted variation in deposited film properties during initial deposition stages, and variation in gap-fill from wafer to wafer.

In the example shown in FIG. 3, the LFM does not provide a stable TEOS flow for about the first 30 seconds. Specifically, a set point of 5% of the full TEOS range is given to the TEOS LFM at t=0 seconds. However, the particular TEOS LFM shown in FIG. 3 exhibits a lag of about 10 seconds as it continues to read zero. Moreover, between 10 seconds and about 25 seconds into the TEOS flow, the percentage of TEOS in the process gas flow increases unevenly to reach about 5%. Different individual LFMs exhibit slightly different behavior, such that the precise initial TEOS flow profile cannot be anticipated and compensated for with other process parameters. Therefore, stabilizing the TEOS flow prior to initiating the deposition process in accordance with certain embodiments of the present invention may improve consistency of oxide deposited from wafer to wafer.

In order to overcome the intrinsic limitation of uncontrollable TEOS flows at low TEOS flow rates, embodiments in accordance with the present invention may allow the gas to stabilize at a small, non-zero flow prior to elevation to the desired set point. This pre-deposition flow stabilization phase is shown as A' in FIG. 3. TEOS flowed during this pre-deposition stabilization phase A' is shunted directly to the chamber exhaust, by-passing the deposition chamber entirely.

Figure 4:
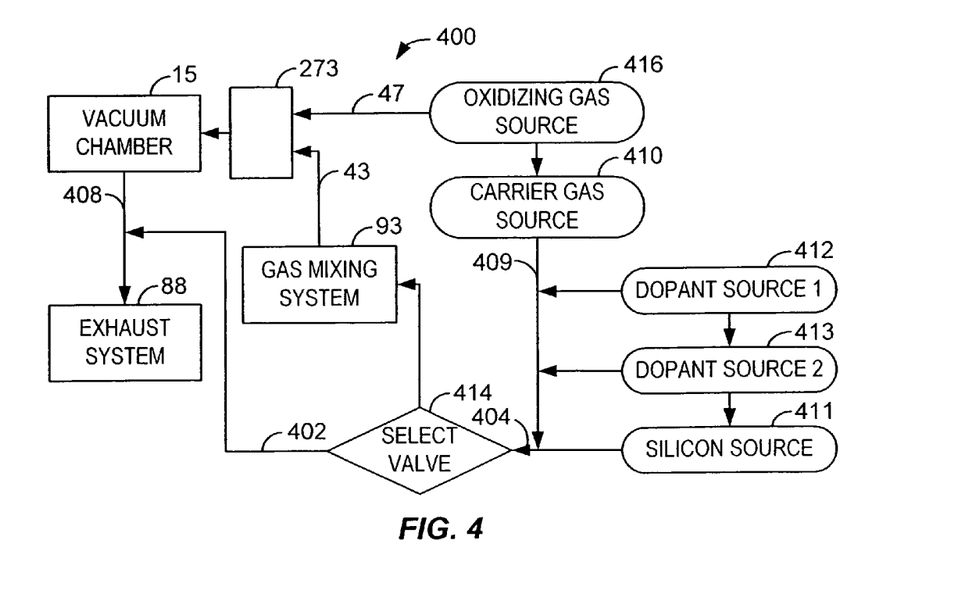
FIG. 4 shows a schematic view of the chamber by-pass structure allowing for pre-deposition stabilization of a process gas flow in accordance with one embodiment of the present invention.

FIG. 4 is a simplified schematic diagram of a CVD deposition apparatus for depositing oxide layers in accordance with embodiments of the present invention. While the apparatus may be used to deposit silicon oxide films, it may also beneficially be applied to single-or multiple-layer doped silicon glass films, such as borophosphosilicate glass ("BPSG"), phosphosilicate glass ("PSG"), borosilicate glass ("BSG"), arsenic-silicon glass ("AsSG"), or similar films.

CVD deposition apparatus 400 comprises oxidizing gas source 416 in fluid communication with vacuum chamber 15 through gas mixing box 273. Carrier gas source 410, silicon-containing gas source 411, first dopant gas (i.e. TEPO) source 412, and second dopant gas (i.e. TEB) source 413 are in fluid communication with vacuum chamber 15 through select valve 414 gas mixing system 93, and gas mixing box 273. Select valve 414 is selectively operable to shunt silicon- and dopant-containing gases such as TEOS vapor through divert line 402 to foreline 408 of chamber exhaust system 88, thereby circumventing vacuum chamber 15 entirely. Select valve 414 and divert line 402 allow the flow of silicon-containing gas to stabilize prior to its being routed to the vacuum chamber to commence an oxide CVD step in accordance with an embodiment of the present invention.

In the pre-deposition phase A' of the process shown in FIG. 3, the percentage of TEOS present in the flowed process gas is maintained at a 5% of the full range for about 35 seconds. Once the TEOS gas flow has stabilized at 5%, at 60 seconds into the TEOS flow the TEOS is allowed to enter the processing chamber and be exposed to ozone, thereby commencing initial deposition stage A of the oxide CVD step. During this initial deposition stage A, oxide formed over the substrate exhibits a high degree of conformality, but is deposited at relatively low rates.

As described in detail below, the relative concentration of the TEOS or other silicon-containing gas in the process gas flowed to the chamber will vary over the course of the deposition step. However, an oxide CVD step in accordance with the present invention is characterized in that once the silicon-containing gas is introduced into the chamber, it continues to flow into the chamber for the duration of the oxide CVD step.

Beginning with the first deposition stage A of the process shown in FIG. 3, the percentage of TEOS in the flowed process gas is steadily increased. For example, in the specific embodiment shown in FIG. 3, 60 seconds into the initial deposition phase A (and 120 seconds from the initial flowing of the TEOS), the percentage of TEOS has increased to 30% of the full range from the initial setpoint of 5%.

Figure 5:
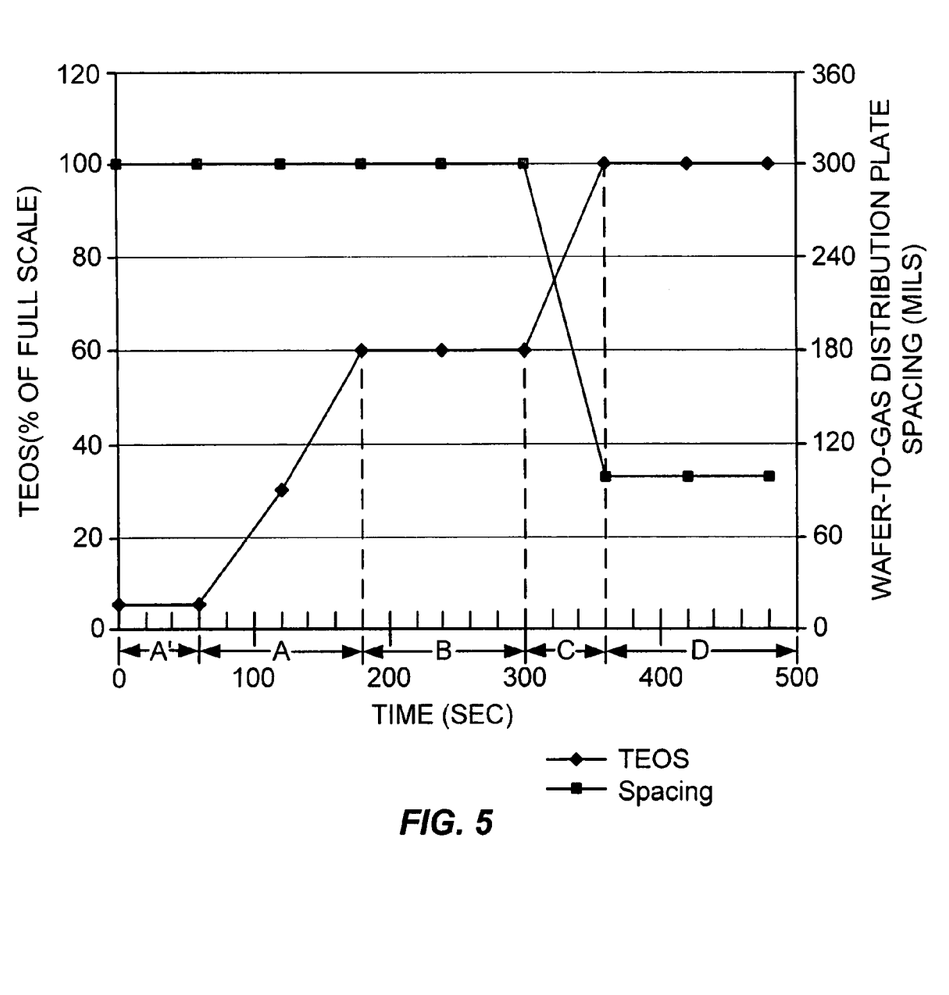
FIG. 5 plots % composition of TEOS in the processing gas mixture flowed during all phases of the embodiment shown in FIG. 3.

FIG. 5 plots percentage of TEOS in the total process gas flowed versus time, for the entire deposition process step whose initial stage is shown in FIG. 3. After about 180 seconds from the point that the TEOS was initially flowed, in stage B the change in $TEOS:O_3$ flow ratio is halted to produce a flow of a processing gas mixture having an unchanging composition of about 60% of the full range of TEOS. Conditions during interim deposition stage B permit formation of additional volumes of oxide material at high rates, for example as may be useful to fill the volume of a larger-sized trench.

After about 300 seconds from the point that TEOS was originally flowed, in stage C the $TEOS:O_3$ flow ratio is again steadily increased to provide deposition of additional silicon oxide material at even higher rates. Such additional deposition may again be useful to fill large volumes of space between features, or to create a bulk layer of oxide overlying the filled features (see description of FIG. 6 below).

In addition to the first vertical axis labeled % TEOS, FIG. 5 also includes a second vertical axis labeled "wafer-to-gas distribution plate spacing." Returning to FIG. 1A, the gas distribution plate 20 of apparatus 10 is positioned over substrate heater 25 which is moveable in a vertical direction. The rate of deposition of silicon oxide and other materials increases as spacing between the wafer surface and gas distribution showerhead is reduced. Conversely, at larger spacing between the wafer surface and the gas distribution plate the rate of deposition is reduced but the conformal characteristics of the deposited film is improved.

Accordingly, FIG. 5 shows that during stage C of the oxide CVD process step, spacing between the wafer and the gas distribution plate is steadily reduced from 300 mils to about 100 mils. This decreased spacing further enhances the rate of deposition of the oxide material during this stage C of the deposition step.

In final stage D of the process illustrated in FIGS. 3 and 5, after 360 sec. from the original time of flowing of the TEOS, the TEOS:ozone ratio is stabilized at 100% of the maximum TEOS concentration utilized during the entire deposition process, resulting in deposition of oxide films at a maximum rate. Such rapid deposition with relatively low conformality may be desirable, for example, where the oxide is being deposited as a bulk layer overlying an oxide filled feature As described below in connection with FIG. 6, such a bulk oxide layer may serve as a useful starting point for subsequent processing, for example a chemical mechanical polishing (CMP) process.

Embodiments in accordance with the present invention offer a number of advantages over deposition of silicon oxide utilizing conventional approaches. One advantage is high conformality and favorable step coverage and gap-fill, while maintaining a high throughput.

Specifically, conventional processes allow for a flow of processing gas comprising an unvarying concentration of TEOS for a set duration. Under such conditions, a low TEOS:ozone ratio provides deposition conditions optimal for gap-fill and film conformity. However, the rate of oxide deposition is low, adversely affecting process throughput.

One possible compromise is a conventional two-step process described briefly above, wherein a first step is performed under process conditions with a low TEOS:ozone ratio and low deposition rate for achieving the desired gap-fill. The flow of silicon-containing gas to the chamber is interrupted, and then a second distinct step is performed under different conditions with a high TEOS:ozone ratio and a high deposition rate for bulk fill. However, such a two-step process may exhibit reduced throughput due to the extended time required in the first step, and also the time consumed in halting the flow of process gas to the chamber and changing the apparatus configuration between the first and second steps. By contrast, embodiments in accordance with the present invention accomplish deposition of conformal oxide layers with acceptable throughput by increasing the amount of TEOS in a controlled manner over the course of the unitary deposition step.

Figure 6:
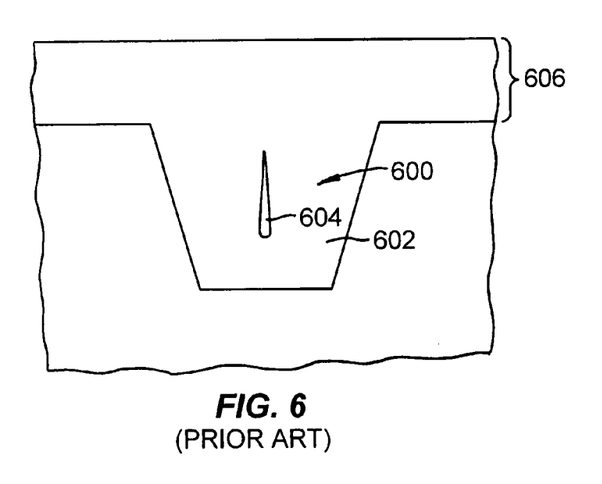
FIG. 6 shows a simplified cross-sectional view of a trench filled with oxide utilizing conventional deposition techniques.

Another potential advantage conferred by embodiments in accordance with the present invention is improved quality of the deposited silicon oxide material. For example, FIG. 6 shows a simplified cross-sectional view of an example of trench 600 filled with silicon oxide 602 deposited utilizing a conventional process. FIG. 6 shows that the increased rate of deposition of oxide material on the raised edges of the trench 600 has resulted in pinching-off of the trench and created unwanted void or pinhole defect 604 within the feature. Void 604 can adversely affect the operation of a semiconductor device that is relying upon the consistent dielectric strength of the oxide-filled trench.

FIG. 6 also shows formation of bulk oxide layer 606 over oxide-filled trench 600. Bulk layer 606 provides additional dielectric material to serve as the starting point for continued processing, for example subsequent chemical-mechanical polishing. Because bulk layer 606 overlies oxide the filled features, it is substantially planar and conformality and gap-fill are not particularly important characteristics of the deposited material.

Figure 7A:
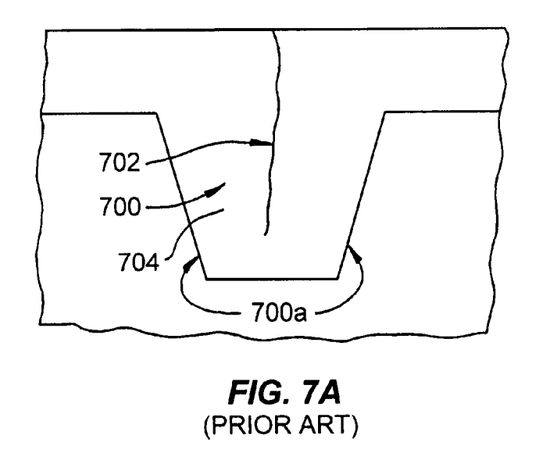
FIG. 7A shows a simplified cross-sectional view of a second trench filled with oxide utilizing conventional deposition techniques.

FIG. 7A shows a simplified cross-sectional view of another example of a trench 700 filled with silicon oxide deposited utilizing a conventional process. FIG. 7A shows that while pinch-off and void formation has not occurred, weak seam 702 is formed where silicon oxide material 704 grown outward from opposed sidewalls 700a of trench 700, meets.

Figure 7B:
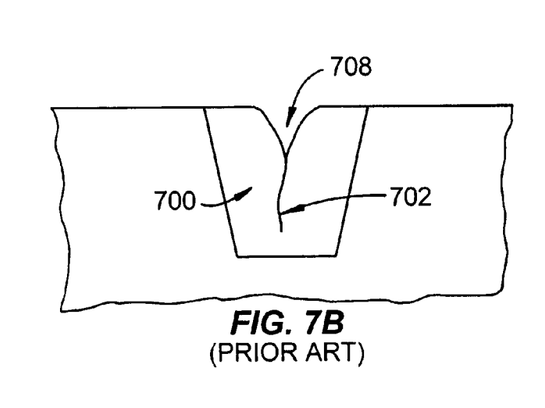
FIG. 7B shows a simplified cross-sectional view of the conventional oxide-filled trench of FIG. 7A after a chemical mechanical polishing.

The relatively poor quality of seam 702 results in oxide along this seam being removed at faster rates relative to the surrounding oxide material when the oxide layer is exposed to an etchant such as hydrofluoric acid (HF) FIG. 7B shows a simplified cross-sectional view of the oxide-filled trench 700 of FIG. 7A after exposure to chemical mechanical polishing (CMP) and post-CMP cleaning utilizing HF etchant. FIG. 7B illustrates that the enhanced rate of etching along seam 702 has resulted in unwanted dishing 708 in the surface of the oxide-filled trench 700. Such dishing 708 can adversely affect operation of a semiconductor device relying upon the consistent dielectric strength of the oxide-filled trench feature.

Figure 8:
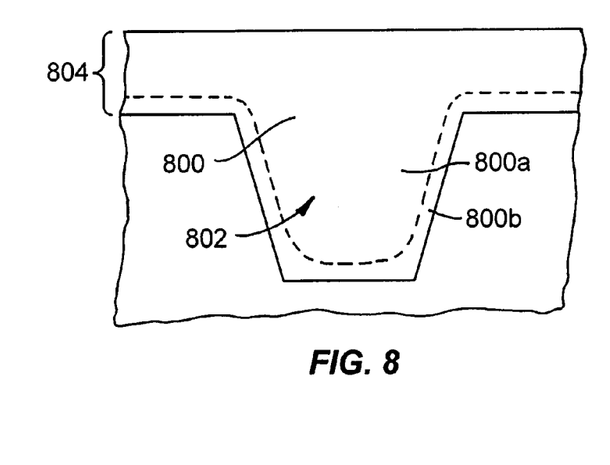
FIG. 8 shows a simplified cross-sectional view of an oxide-filled trench in accordance with an embodiment of the present invention.

FIGS. 6 and 7A–B are to be contrasted with FIG. 8, which shows a simplified cross-sectional view of an oxide-filled trench structure formed utilizing an embodiment of a process in accordance with the present invention. Specifically, the time-varied ratio of TEOS:ozone process gases flowed during the deposition process results in formation of an oxide film 800 that includes a highly conformal portion 800a proximate to the surrounding silicon sidewalls, but which also includes a less-conformal body portion 800b which fills the entire volume of the trench 802 and creates overlying bulk layer 804 in a reasonable period of time. The oxide-filled trench 802 of FIG. 8 does not include the voids or weak seams associated with similar features formed utilizing the conventional oxide CVD processes previously described.

While the above is a complete description of specific embodiments of the present invention, various modifications, variations, and alternatives may be employed. For example, while the embodiment of a process in accordance with the present invention shown and described in conjunction with FIGS. 3 and 5 includes a pre-deposition gas flow stabilization phase A' during which the flow of gas is diverted from the processing chamber, this is not necessarily required by the present invention. Alternative embodiments of process recipes in accordance with the present invention could call for flowing the silicon-containing component of the process gas flow at a sufficiently high initial concentration to allow the process gases to be introduced directly into the chamber, without an initial flow diversion phase.

Moreover, other techniques for varying the parameters of deposition of an oxide layer could be employed in conjunction with the variation in concentration of the process gas flow components described so far. One example of a process parameter that can be varied is the wafer-to-gas distribution plate spacing described and illustrated in conjunction with FIG. 5. Examples of other possible parameters to be varied include but are not limited to the temperature of deposition, the pressure of deposition, and the flow rate of processing gases containing dopants such as As, B, and P.

The specific process illustrated in FIGS. 3 and 5 represents only one example of a particular deposition process in accordance with the present invention, and specific parameters of the process could be varied to accomplish the results desired for a particular application.

Thus while FIGS. 3 and 5 show a variation over time in the concentration of vaporized TEOS relative to ozone, the present invention is not limited to this particular combination of process gases, and alternative embodiments in accordance with the present invention could utilize other process gases. For example, a list of silicon-containing processing gases potentially useful in conjunction with the present invention includes but is not limited to silane, trimethylsilane, tetramethylsilane, dimethylsilane, diethylsilane, and tetramethylcyclotetrasiloxane (TOMCATS). Examples of other possible oxidizing processing gases useful in conjunction with the present invention include but are not limited to oxygen, steam, and nitrogen dioxide ($NO_2$).

And while FIGS. 3 and 5 illustrate a deposition process step wherein the percentage contribution of silicon-containing process gas in the overall process gas flow is increased over time, this is not required by the present invention. In alternative embodiments, the percentage contribution of silicon-containing process gas in the overall process flow may be reduced, reduced and then increased, or increased and then reduced, over the course of a single deposition step.

Figure 9A:
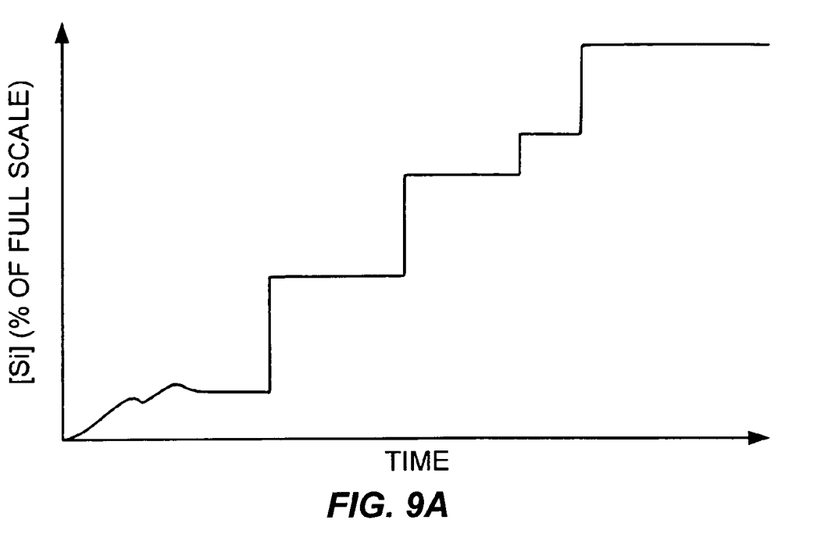
FIG. 9A is a simplified graph plotting the relative concentration of a silicon-containing component over time, for an alternative embodiment of a deposition process in accordance with the present invention featuring a stepped profile.
Figure 9B:
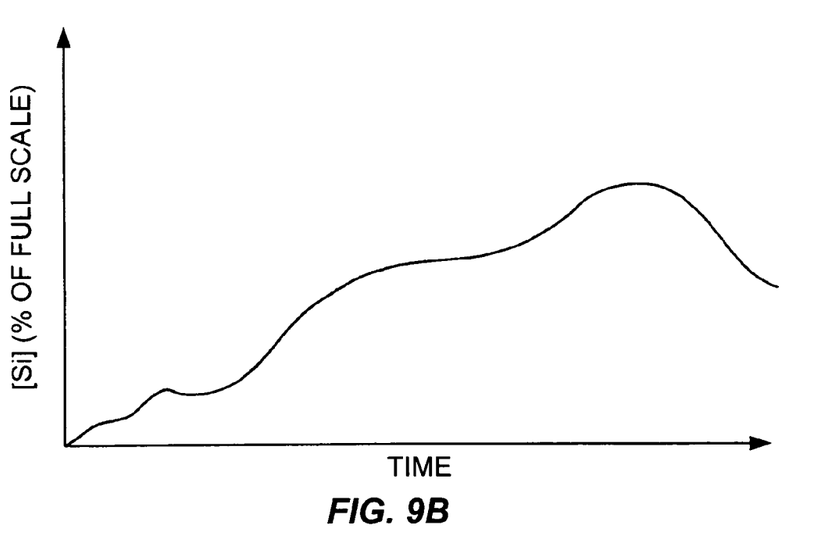
FIG. 9B is a simplified graph plotting the relative concentration of a silicon-containing component over time, for another alternative embodiment of a deposition process in accordance with the present invention featuring a sinusoidal profile.

Moreover, while FIG. 5 shows a deposition process step wherein the concentration of a silicon-containing component of a processing gas flow is increased in a linear fashion over two stages separated by a stage of constant concentration, embodiments in accordance with the present invention are not limited to this particular concentration variation profile. Alternative embodiments in accordance with the present invention could exhibit a wide variety of changing, non-linear composition profiles. FIG. 9A is a simplified graph plotting the concentration of a silicon-containing gas component relative to a process maximum, versus time, for an alternative embodiment of a deposition process in accordance with the present invention featuring a stepped profile. FIG. 9B is a simplified graph plotting the concentration of a silicon-containing gas component relative to a process maximum, versus time, for another alternative embodiment of a deposition process in accordance with the present invention featuring a nonlinear profile.

Changes in composition of process gases flowed during deposition of silicon oxide in accordance with the present invention may be accomplished in a variety of ways. In the process shown in FIGS. 3 and 5, for example, only the relative percentage of TEOS in the overall process gas flow is shown as increasing. Such an increase could be produced by elevating the flow rate of the silicon-containing gas, reducing the flow rate of the oxidizing component of the process gas, or any combination of a change in flow rates of the components of the processing gas mixture which results in a change in the overall percentage composition of the silicon-containing gas.

Moreover, a change in the relative ratio of components of the processing gas mixture may be accomplished by other than changing the flow rates of the components. For example, ozone is frequently formed by flowing oxygen through an ozone generator, resulting in a gas flow comprising oxygen and some percentage of ozone. Changes in the concentration of silicon-containing gas relative to ozone could also be accomplished by altering the conditions of generation of the ozone to increase its concentration, without altering the flow rate of the ozone into the processing chamber.

Other variations on the illustrated embodiments will be apparent to persons of skill in the art. These equivalents and alternatives are intended to be included within the scope of the present invention. Therefore, the scope of this invention should not be limited to the embodiments described, and should instead be defined by the following claims.

What is claimed is:

1. A method for forming a silicon oxide layer comprising:
providing a continuous flow of a silicon-containing processing gas to a chamber housing a substrate;
providing a flow of an oxidizing processing gas to the chamber;
providing a flow of a processing gas containing a dopant;
causing a reaction between the silicon-containing processing gas, the dopant containing gas, and the oxidizing processing gas to form a silicon oxide layer; and
varying over time a ratio of the silicon-containing gas: oxidizing gas flowed into the chamber to alter a rate of deposition of the silicon oxide on the substrate.

2. The method of claim 1 wherein:
providing a flow of the silicon-containing gas comprises providing a flow of tetraethylorthosilicate (TEOS); and
providing a flow of the oxidizing processing gas comprises providing a flow of ozone.

3. The method of claim 1 wherein varying the ratio of the silicon-containing gas to the oxidizing gas comprises increasing a flow rate of the silicon-containing gas relative to a flow rate of the oxidizing gas.

4. The method of claim 3 wherein varying the ratio of the silicon-containing gas to the oxidizing gas comprises increasing a flow rate of the silicon-containing gas while the flow rate of the oxidizing gas remains constant.

5. The method of claim 3 wherein the silicon oxide is deposited within a recess in the substrate such that a conformal silicon oxide is initially formed within the recess at a first time, followed by formation of a less conformal silicon oxide at a second time.

6. The method of claim 5 wherein the recess comprises a shallow trench positioned between the expected location of adjacent semiconductor devices.

7. The method of claim 5 wherein the recess comprises a space between raised features on the substrate.

8. The method of claim 5 wherein the recess a space between lines of an interconnect metallization structure.

9. The method of claim 1 wherein providing a flow of the silicon-containing gas comprises providing a flow of a gas selected from the group consisting of silane, trimethylsilane, tetramethylsilane, dimethylsilane, diethylsilane, and tetramethylcyclotetrasiloxane, or mixtures thereof.

10. The method of claim 1 wherein providing a flow of the oxidizing gas comprises providing a flow of a gas selected from the group consisting of ozone, oxygen, steam, and $NO_2$, or mixtures thereof.

11. The method of claim 1 wherein varying the ratio of the silicon-containing gas to the oxidizing gas results in a linear change in concentration of the silicon-containing gas over time.

12. The method of claim 1 wherein varying the ratio of the silicon-containing gas to the oxidizing gas results in a nonlinear change in concentration of the silicon-containing gas over time.

13. The method of claim 12 wherein the nonlinear change comprises a step-wise change in concentration of the silicon-containing gas over time.

14. The method of claim 1 further comprising varying, during deposition of the oxide material, a spacing between the substrate and a gas distribution plate introducing the process gases into the chamber.

15. The method of claim 14 wherein the spacing is reduced to enhance a rate of deposition of the silicon oxide.

16. The method of claim 1 further comprising diverting, prior to deposition, the flow of the silicon-containing process gas upstream of the chamber to an exhaust until a rate of the silicon-containing process gas flow has stabilized.

17. The method of claim 1 further comprising varying a flow rate of the dopant containing processing gas.

18. The method of claim 1 wherein the dopant containing processing gas includes a dopant selected from the group consisting of boron, phosphorous, and arsenic.

19. A method for forming a silicon oxide layer comprising:
providing a continuous flow of a silicon-containing processing gas to a chamber housing a substrate;
providing a flow of an oxidizing processing gas to the chamber;
providing a flow of a processing gas containing a dopant;
causing a reaction between the silicon-containing processing gas, the dopant containing gas, and the oxidizing processing gas to form a silicon oxide layer; and
varying over time a ratio of the silicon-containing gas: dopant containing gas flowed into the chamber to alter a rate of deposition of the silicon oxide on the substrate.

20. The method of claim 19 wherein:
providing a flow of the silicon-containing gas comprises providing a flow of tetraethylorthosilicate (TEOS); and
providing a flow of the oxidizing processing gas comprises providing a flow of ozone.

21. The method of claim 19 wherein varying the ratio of the silicon-containing gas to the dopant containing gas comprises changing a flow rate of the dopant containing gas.

22. The method of claim 19 wherein the silicon oxide is deposited within a recess in the substrate such that a conformal silicon oxide is initially formed within the recess at a first time, followed by formation of a less conformal silicon oxide at a second time.

23. The method of claim 22 wherein the recess comprises a shallow trench positioned between the expected location of adjacent semiconductor devices.

24. The method of claim 22 wherein the recess comprises a space between raised features on the substrate.

25. The method of claim 22 wherein the recess comprises a space between lines of an interconnect metallization structure.

26. The method of claim 19 wherein providing a flow of the silicon-containing gas comprises providing a flow of a gas selected from the group consisting of silane, trimethylsilane, tetramethylsilane, dimethylsilane, diethylsilane, and tetramethylcyclotetrasiloxane, or mixtures thereof.

27. The method of claim 19 wherein providing a flow of the oxidizing gas comprises providing a flow of a gas selected from the group consisting of ozone, oxygen, steam, and $NO_2$, or mixtures thereof.

28. The method of claim 19 wherein varying the ratio of the dopant containing gas to the silicon-containing gas results in a linear change in concentration of the silicon-containing gas over time.

29. The method of claim 19 wherein varying the ratio of the dopant containing gas to the silicon-containing gas results in a nonlinear change in concentration of the silicon-containing gas over time.

30. The method of claim 29 wherein the nonlinear change comprises a step-wise change in concentration of the silicon-containing gas over time.

31. The method of claim 19 further comprising varying, during deposition of the oxide material, a spacing between the substrate and a gas distribution plate introducing the process gases into the chamber.

32. The method of claim 31 wherein the spacing is reduced to enhance a rate of deposition of the silicon oxide.

33. The method of claim 19 further comprising diverting, prior to deposition, the flow of the silicon-containing process gas upstream of the chamber to an exhaust until a rate of the silicon-containing process gas flow has stabilized.

34. The method of claim 19 wherein flowing the dopant containing processing gas includes flowing gas having a dopant selected from the group consisting of boron, phosphorous, and arsenic.

35. A method for forming a silicon oxide layer comprising:
providing a continuous flow of a silicon-containing processing gas to a chamber housing a substrate;
providing a flow of an oxidizing processing gas to the chamber;
causing a reaction between the silicon-containing processing gas and the oxidizing processing gas to form a silicon oxide layer;
varying over time a ratio of the silicon-containing gas: oxidizing gas flowed into the chamber to alter a rate of deposition of the silicon oxide on the substrate; and
varying during deposition of the oxide material, a spacing between the substrate and a gas distribution plate introducing gases into the chamber, between about 300 Å and about 100 Å.

36. The method of claim 35 further comprising providing a flow of a processing gas containing a dopant to the chamber, such that the silicon-containing processing gas, the dopant containing gas, and the oxidizing processing gas react to form a silicon oxide layer.

37. The method of claim 36 wherein flowing the dopant containing gas comprises flowing the dopant containing gas including a dopant selected from the group consisting of boron, phosphorous, and arsenic.

38. The method of claim 36 further comprising varying over time a flow rate of the dopant containing gas to alter a rate of deposition of the silicon oxide on the substrate.

39. The method of claim 35 wherein:
providing a flow of the silicon-containing gas comprises providing a flow of tetraethylorthosilicate (TEOS); and
providing a flow of the oxidizing processing gas comprises providing a flow of ozone.

40. The method of claim 35 wherein varying the ratio of the silicon-containing gas to the oxidizing gas comprises changing a flow rate of the silicon-containing gas relative to a flow rate of the oxidizing gas.

41. The method of claim 35 wherein the silicon oxide is deposited within a recess in the substrate such that a conformal silicon oxide is initially formed within the recess at a first time, followed by formation of a less conformal silicon oxide at a second time.

42. The method of claim 41 wherein the recess comprises a shallow trench positioned between the expected location of adjacent semiconductor devices.

43. The method of claim 41 wherein the recess comprises a space between raised features on the substrate.

44. The method of claim 41 wherein the recess a space between lines of an interconnect metallization structure.

45. The method of claim 35 wherein providing a flow of the silicon-containing gas comprises providing a flow of a gas selected from the group consisting of silane, trimethylsilane, tetramethylsilane, dimethylsilane, diethylsilane, and tetramethylcyclotetrasiloxane, or mixtures thereof.

46. The method of claim 35 wherein providing a flow of the oxidizing gas comprises providing a flow of a gas selected from the group consisting of ozone, oxygen, steam, and $NO_2$, or mixtures thereof.

* * * * *